(12) United States Patent
Xu et al.

(10) Patent No.: US 11,508,932 B2
(45) Date of Patent: Nov. 22, 2022

(54) PACKAGE STRUCTURE, DISPLAY PANEL, DISPLAY DEVICE, AND METHOD FOR DETECTING PACKAGE STRUCTURE

(71) Applicants: BOE TECHNOLOGY GROUP CO., LTD., Beijing (CN); HEFEI BOE DISPLAY TECHNOLOGY CO., LTD., Anhui (CN)

(72) Inventors: Dong Xu, Beijing (CN); Yajun Li, Beijing (CN); Kai Wang, Beijing (CN); Feng Yu, Beijing (CN)

(73) Assignees: BEIJING BOE TECHNOLOGY DEVELOPMENT CO., LTD., Beijing (CN); HEFEI BOE DISPLAY TECHNOLOGY CO., LTD., Anhui (CN)

( * ) Notice: Subject to any disclaimer, the term of this patent is extended or adjusted under 35 U.S.C. 154(b) by 1029 days.

(21) Appl. No.: 16/305,566

(22) PCT Filed: Feb. 14, 2018

(86) PCT No.: PCT/CN2018/076800
§ 371 (c)(1),
(2) Date: Nov. 29, 2018

(87) PCT Pub. No.: WO2019/015322
PCT Pub. Date: Jan. 24, 2019

(65) Prior Publication Data
US 2021/0257584 A1   Aug. 19, 2021

(30) Foreign Application Priority Data

Jul. 19, 2017   (CN) .......................... 201710589756.8

(51) Int. Cl.
| | | |
|---|---|---|
| *H01L 51/52* | (2006.01) | |
| *G01M 3/38* | (2006.01) | |
| *G01N 21/64* | (2006.01) | |
| *H01L 51/00* | (2006.01) | |
| *G01N 21/78* | (2006.01) | |

(52) U.S. Cl.
CPC .......... *H01L 51/5246* (2013.01); *G01M 3/38* (2013.01); *G01N 21/64* (2013.01); *H01L 51/0031* (2013.01); *G01N 21/783* (2013.01)

(58) Field of Classification Search
CPC . H01L 51/5246; H01L 51/0031; H01L 27/32; H01L 51/5237; G01M 3/38; G01N 21/64; G01N 21/783
See application file for complete search history.

(56) References Cited

U.S. PATENT DOCUMENTS

2015/0090005 A1* 4/2015 Thomas ................ G01M 3/047
                                                                73/40

FOREIGN PATENT DOCUMENTS

| CN | 1529820 A | 9/2004 |
|---|---|---|
| CN | 102175624 A | 9/2011 |

(Continued)

OTHER PUBLICATIONS

China Reexamination Notification, Application No. 201710589756.8, dated Mar. 19, 2020, 10 pps.: with English translation.

(Continued)

*Primary Examiner* — David Z Huang
(74) *Attorney, Agent, or Firm* — Armstrong Teasdale LLP

(57) ABSTRACT

The present disclosure relates to a package structure, a display panel, a display device, and a method for detecting a package structure. The package structure includes a first package layer and a second package layer disposed opposite to each other, and a sealing element between the first package layer and the second package layer for forming a sealed space between the first package layer and the second package layer. The package structure further includes a detecting element located in the sealed space, the detecting element including an oxygen sensitive material, the oxygen sensitive material including a material whose light emission characteristics are changed after exposure to oxygen.

5 Claims, 3 Drawing Sheets

(56) References Cited

FOREIGN PATENT DOCUMENTS

| CN | 103217459 A | 7/2013 |
|---|---|---|
| CN | 103730071 A | 4/2014 |
| CN | 103837546 A | 6/2014 |
| CN | 104332562 A | 2/2015 |
| CN | 105679961 A | 6/2016 |
| CN | 106024842 A | 10/2016 |
| CN | 106124384 A | 11/2016 |
| CN | 107369701 A | 11/2017 |

OTHER PUBLICATIONS

Ji Chanyehua, "OLED Display Basics and Industrialization", edited by China Electronics Video Industry Association, ISBN 978-7-5647-2814-4, Feb. 2015, 7 pps.: with English translation.
University Laboratory Open Fund of "Capital Normal University", "Paper Collection on Projects", edited by the Academic Affairs Office of Capital Normal University, ISBN 7-81064-459-9, 2001-2002, 4 pps.: with English translation.
"Principles and Applications of Polymer Photochemistry", edited by Li Shanjun et al., ISBN 7-309-00741-7/0.100, 1998, 6 pps.: with English translation.
PCT International Search Report, Application No. PCT/CN2018/076800, dated May 22, 2018, 6 pages: with English translation.
PCT Written Opinion, Application No. PCT/CN2018/076800, dated May 22, 2018, 5 pages.: with English translation of relevant part.
China First Office Action, Application No. 201710589756.8, dated Nov. 5, 2018, 16 pps.: with English translation.

* cited by examiner

PACKAGE STRUCTURE, DISPLAY PANEL, DISPLAY DEVICE, AND METHOD FOR DETECTING PACKAGE STRUCTURE

CROSS REFERENCE TO RELATED APPLICATIONS

This patent application is a National Stage Entry of PCT/CN2018/076800 filed on Feb. 14, 2018, which claims the benefit and priority of Chinese Patent Application No. 201710589756.8 filed on Jul. 19, 2017, the disclosures of which are incorporated herein by reference in their entirety as part of the present application.

BACKGROUND

The present disclosure relates to a field of packaging technology. More particularly, it relates to a package structure, a display panel, a display device and a method for detecting a package structure.

The packaging effect has an effect on the structure being packaged. For example, for displays, especially OLED displays, their service life and production yield are affected by the packaging effect. Therefore, the detection of efficient and simple packaging effect is of great significance, and there is an urgent need in the art for the sealing detection of the package structure.

BRIEF DESCRIPTION

According to a first aspect, some embodiments of the present disclosure provide a package structure. The package structure includes a first package layer and a second package layer disposed opposite to each other, and a sealing element between the first package layer and the second package layer for forming a sealed space between the first package layer and the second package layer. The package structure further includes a detecting element located in the sealed space. The detecting element includes an oxygen sensitive material. The oxygen sensitive material includes a material whose light emission characteristics are changed after exposure to oxygen.

In an embodiment, the oxygen sensitive material includes least one of the group consisting of: a phosphorescent material, a fluorescent phosphorescent dual emissive material.

In an embodiment, the fluorescent phosphorescent dual emissive material includes a copolymer of aromatic ketone monomer units.

In an embodiment, the copolymer includes at least one of the following: polyurethane, polylactide, and polyacrylate.

In an embodiment, the polyurethane has the following structure:

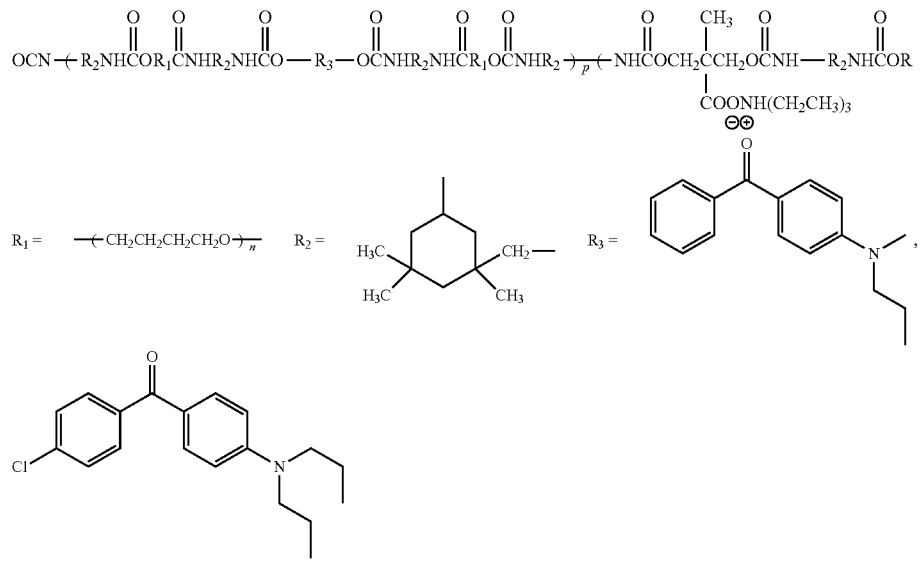

The polylactide has the following structure:

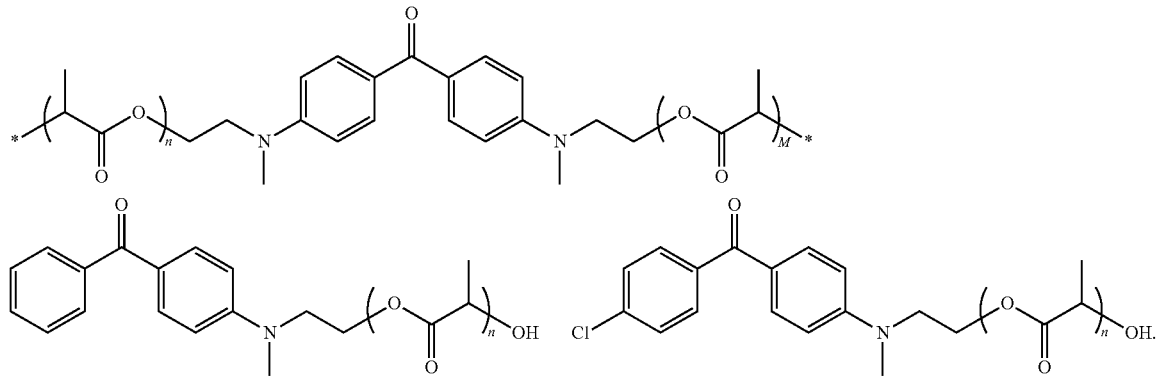

The polyacrylate has the following structure:

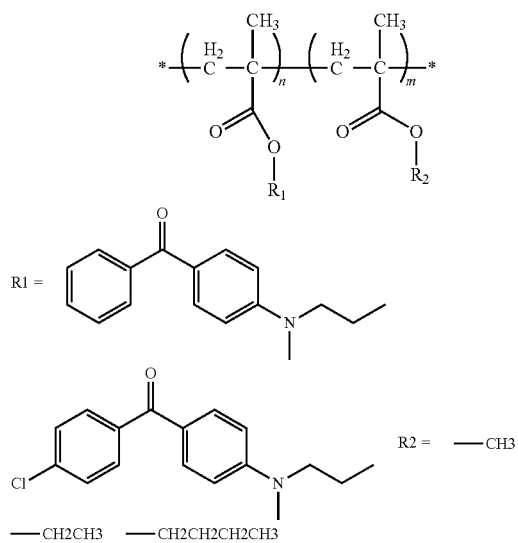

According to a second aspect, some embodiments of the present disclosure provide a display panel. The display panel includes the package structure of the embodiments described above, wherein the first package layer is a first substrate of the display panel, and the second package layer is a second substrate of the display panel.

In an embodiment, the sealing element is a sealant.

In an embodiment, the detecting element is configured to perform a secondary sealing on the display panel.

According to a third aspect, some embodiments of the present disclosure provide a display device. The display device includes the display panel of the embodiments described above.

According to a fourth aspect, some embodiments of the present disclosure provide a method for detecting a package structure. The method includes irradiating the package structure according to claim 1 with excitation electromagnetic radiation, and determining whether the sealing element has an oxygen leak based on a light emission characteristic of the detecting element.

In an embodiment, the oxygen sensitive material includes a phosphorescent material, and determining whether the sealing element has an oxygen leak based on a light emission characteristic of the detecting element includes when or after irradiating the package structure with the excitation electromagnetic radiation, determining that the sealing element has oxygen leakage in response to at least a portion of the detecting element not emitting phosphorescence.

In an embodiment, the method further includes determining a portion of the sealing element corresponding to at least a portion of the detecting element that does not emit phosphorescence as a leakage occurrence portion.

In an embodiment, the oxygen sensitive material includes a fluorescent phosphorescent dual emitting material or a combination of a fluorescent phosphorescent dual emitting material and a phosphorescent material, determining whether the sealing element has an oxygen leak based on a light emission characteristic of the detecting element includes when irradiating with electromagnetic radiation, in response to at least a portion of the detecting element emitting only fluorescence, determining that the sealing element has an oxygen leak, or, after irradiating with electromagnetic radiation, in response to at least a portion of the detecting element not emitting phosphorescence, determining that the sealing element has an oxygen leak.

In an embodiment, the method further includes determining a portion of the sealing element corresponding to at least a portion of the detecting element that only emits fluorescence when being irradiated with electromagnetic radiation as a leakage occurrence portion, or, determining a portion of the sealing element corresponding to at least a portion of the detecting element that does not emit phosphorescence after being irradiated with electromagnetic radiation as a leakage occurrence portion.

In an embodiment, the fluorescent phosphorescent dual emissive material includes a copolymer of aromatic ketone monomer units.

In an embodiment, the copolymer includes at least one of the following: polyurethane, polylactide, and polyacrylate.

In an embodiment, the electromagnetic radiation is ultraviolet light. The polyurethane has the following structure:

The polylactide has the following structure:

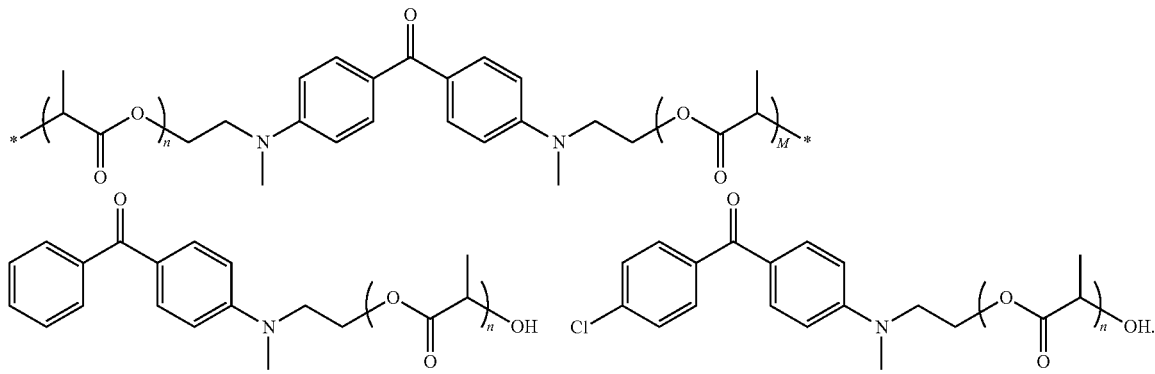

The polyacrylate has the following structure:

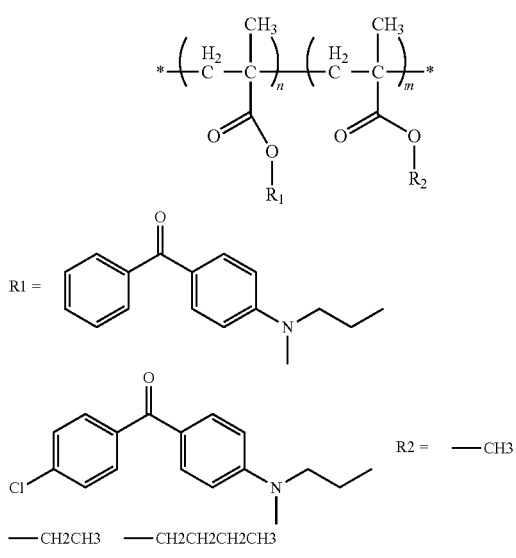

According to a fifth aspect, some embodiments of the present disclosure provide a detecting device configured to detect whether the package structure described above is subjected to oxygen exposure. The detecting device includes an illumination source configured to emit electromagnetic radiation to the package structure, and a sensor configured to detect a change in light emission characteristics of the oxygen sensitive material in the package structure.

In an embodiment, the illumination source includes an ultraviolet light source.

In an embodiment, the sensor includes a spectrometer.

BRIEF DESCRIPTION OF THE DRAWINGS

To describe the technical solutions in the embodiments of the present disclosure more clearly, the accompanying drawings of the embodiments are briefly described below. It should be understood that the drawings described below refer only to some embodiments of the present disclosure, and not to restrict the present disclosure, wherein.

DETAILED DESCRIPTION

Figure 1:
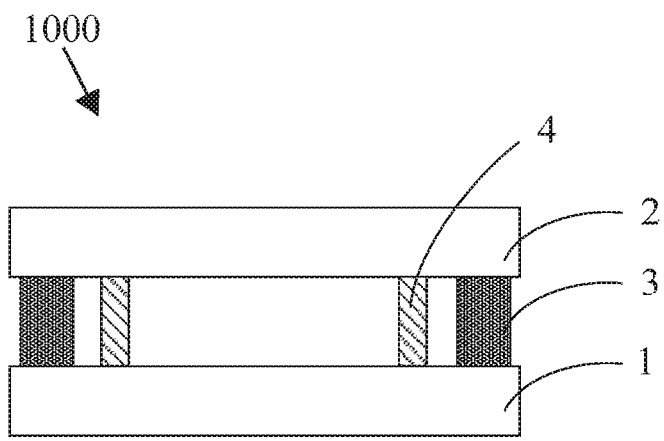
FIG. 1 is a schematic view of a package structure according to an embodiment of the present disclosure.

To make the technical solution, and advantages of the present disclosure clearer, the technical solutions of the embodiments of the present disclosure will be clearly and completely described below in conjunction with the drawings. Obviously, the embodiments described are part of embodiments of the present disclosure, instead of all the embodiments. Based on the described embodiments of the present disclosure, all other embodiments obtained by those skilled in the art without creative work also fall within the scope of protection sought for by the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the terms "comprising," "including," "containing" and "having" are to be interpreted inclusively rather than exclusively.

For the purpose of the literal description below, the terms "up", "down", "left", "right", "vertical", "horizontal", "top", "bottom" and derivatives thereof should relate to the present disclosure as denoted in the direction as in the drawings. The term "overriding", "on top of", "provided on . . . ", or "provided on top of" means that a first element such as a first structure exists on a second element such as a second structure, wherein an intermediate element such as an interface structure may exist between the first element and the second element. The term "contacting" means connecting a first element such as a first structure and a second element such as a second structure, while there may be or may not be other element at the interface of the two elements.

In the technique known to the inventors, for the sealing inspection of the package structure, some detection methods are based on the poor characterization of the package when it is eroded to determine whether the package is damaged. Such technical solutions have a large hysteresis and based on indirect detection, causing insufficient reliability and accuracy. Some detection methods are based on visual observation of the package to determine whether it is damaged or not. Such technical solutions cannot detect small damages such as pores, cracks, etc., and rely on experience of the inspector. Some detection methods are based on the detection of water-binding discoloration effects of salts of metal compounds. Such technical solutions can only be used to detect high-concentration water vapor erosion or long-term accumulation of low-concentration water vapor erosion. Besides, the detection efficiency is low. The hysteresis is large, and it is not applicable to non-water vapor erosion or trace water vapor permeation. Some technical solutions are based on the indirect change of the resistivity of the active metal in the presence of air. Such technical solution has strict waterless and oxygen-free sealing requirements for the active metal-based detection device, and needs to be equipped with a matching detection circuit, which is costly and difficult to maintain.

Embodiments of the present disclosure provide a package structure, a display panel, a display device, and a method for detecting a package structure, which are at least partially capable of solving the above-described sealing effect detection method.

In the detailed description of the embodiments described below, the so-called oxygen sensitivity may be, for example, sensitive to air, oxygen, moisture, water and oxygen, and the like. The changes in light emission characteristics of the so-called oxygen-sensitive material after exposure to oxygen includes changes in light emission characteristics of the material when exposed to common sealing damage conditions such as air, water vapor, and oxygen.

In the detailed description of the embodiments described below, the light-emitting element may be a light-emitting device in various display structures, such as an electroluminescent device, such as a QLED, an OLED, or the like.

In the detailed description of the embodiments described below, the so-called light emission characteristics may include whether or not emitting light and/or the hue of the emitted light, such as a wavelength of light emission and a color associated therewith.

FIG. 1 is a schematic view of a package structure according to an embodiment of the present disclosure.

As shown in FIG. 1, the package structure 1000 of the embodiment of the present disclosure includes a first package layer 1 and a second package layer 2 disposed opposite to each other; and a sealing element 3 between the first package layer and the second package layer for forming a sealed space between the first package layer and the second package layers. The package structure further includes a detecting element 4 located in the sealed space. The detecting element includes an oxygen sensitive material. The oxygen sensitive material includes a material whose light emission characteristics are changed after exposure to oxygen. Thus, a convenient oxygen leak detecting solution can be provided.

By providing such a detecting unit, it is possible to conveniently determine whether or not oxygen leakage has occurred in the package structure. In the daily environment, a matter which is easy to erode the sealed package structure, such as air or moisture, contains a large amount of oxygen. Therefore, the package structure according to the embodiment of the present disclosure is placed in a daily use environment, and can be conveniently determined whether the package structure has broken.

In some embodiments of the present disclosure, the first and second package layers may be joined together by using a detecting element. For example, the projected area of the detecting element in a direction perpendicular to the first and second package layers is at least not lower than that of the sealing element. Therefore, the secondary sealing of the sealed space can be further formed, and the sealing effect of the package structure is enhanced.

In some embodiments of the present disclosure, the detecting element is configured as one layer having a projected area in a direction perpendicular to the first and second package layers at least not lower than a projected area of the sealing element in a direction perpendicular to the first and second packages. The sealing effect of the package structure is enhanced.

In some embodiments of the present disclosure, the oxygen sensitive material includes at least one of the following: a phosphorescent material and a fluorescent phosphorescent dual emissive material.

In some embodiments of the present disclosure, the fluorescent phosphorescent dual emissive material includes a fluorescent phosphorescent dual emissive material such as an organic high molecular polymer such as a copolymer of aromatic ketone monomer units.

For example, the copolymer of the aromatic ketone monomer unit may include at least one of the following: polyurethanes, polylactides, and polyacrylates.

For example, the polyurethane may have the following structure:

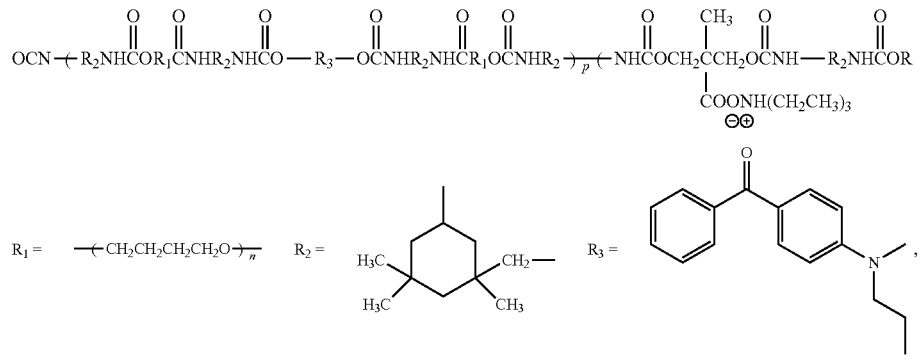

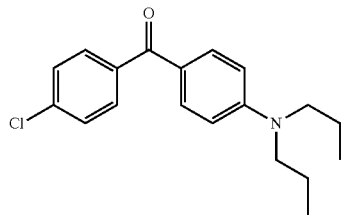

For example, the polylactide may have the following structure:

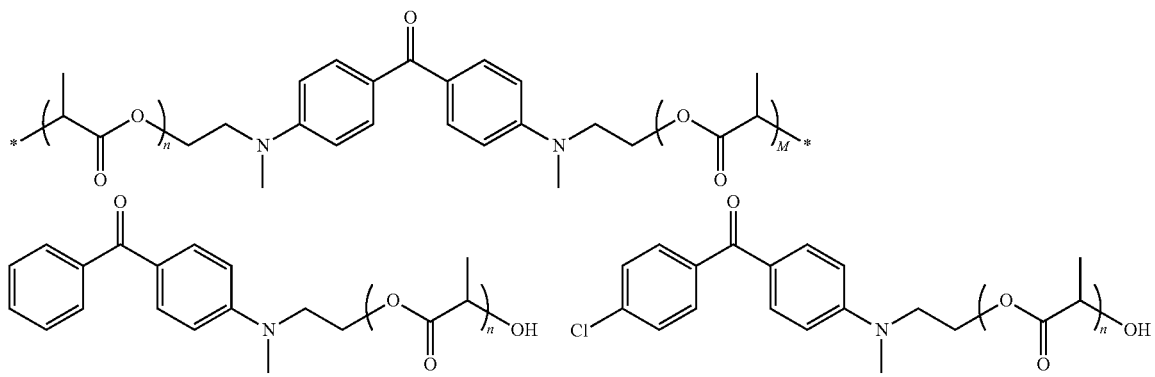

For example, the polyacrylate may have the following structure:

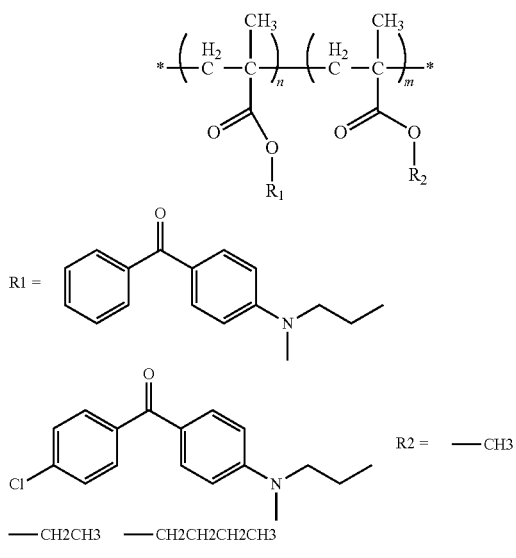

The applicant has extensively studied the technical effects of the technical solutions of the present application. Since the detection circuit is not required, and the material used is non-corrosive and oxidizable, the fabricating process is simple, the environmental requirements are low and the cost is low. At the same time, the materials used above have good sensitivity to various oxygen environments and have a wide range of applications.

According to the technical solution of the embodiments of the present disclosure, experiments have shown that under normal working vacuum conditions (about $10^3$-$10^2$ Pa), light emission characteristics can be changed when sealing leakage and oxygen exposure occur, resulting in significant color changes, especially if fluorescent and phosphorescent dual-emitting materials are used. The above working conditions are much better than the relevant vacuum (about 10 Pa) in the prior art regarding vacuum degree. In the embodiments, the detection limit is high, the visibility is strong and the sensitivity is high.

Figure 2:
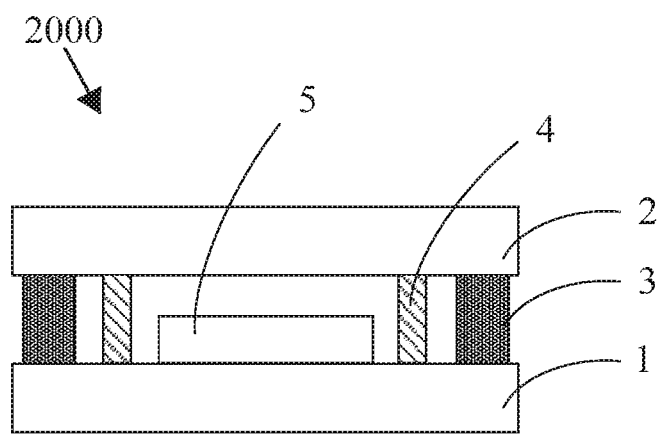
FIG. 2 is a schematic view of a display panel according to an embodiment of the present disclosure.

FIG. 2 is a schematic view of a display panel 2000 according to an embodiment of the present disclosure. The display panel shown in FIG. 2 may include a package structure as described above. The first package layer may be a first substrate of the display panel, and the second package layer may be a second substrate of the display panel.

For example, the first substrate may be a cover plate and the second substrate may be a TFT array substrate.

It can be understood that the display panel further includes a light-emitting element 5 which is enclosed in a sealed space. According to the structural design of the display panel, the light-emitting element can be located on the first or second substrate.

For example, the light-emitting element may be an organic light emitting OLED device, and the organic light emitting OLED device may be located on the second substrate.

For example, the detecting element can be adjacent to the sealing element, for example, inside the sealing element.

It can be understood that, specifically to the structure of the display panel, the sealing element is usually realized by a frame sealant, and the detecting element can be configured as one layer. At this time, vacuum package cavities are formed between the sealing element and the light-emitting element, between the sealing element and the detecting element and between the detecting element and the light-emitting element of the sealing package is not damaged.

Since organic light-emitting devices are sensitive to air, water vapor, etc., the effect of packaging is more important for organic devices. However, the embodiments of the present disclosure provide an efficient and simple solution for detecting the packaging effect, and the detecting element can further block the air, thereby the packaging effect is improved.

In some embodiments of the present disclosure, the detecting element and the sealing element extend simultaneously between the first substrate and second substrate, which helps to determine the position of the leakage when the oxygen leakage occurs in the sealing element. Meanwhile, since the detecting element itself has a certain bonding strength which is beneficial to enhance the bonding effect of the sealing element, such as the sealant.

In some embodiments of the present disclosure, the detecting element may be coated as a layer located between the inside of the sealing element and the light-emitting element and surrounding the light-emitting element, so that the detection of the sealing can be completely realized.

The package structure according to the embodiment of the present disclosure may be applied to the display panel. Convenient, quick, and sensitive oxygen exposure detection may be realized and the bonding and sealing effect of the display panel may be significantly improved.

Taking the polyurethane structure as an example, under the hot pressing of about 120° C. and about 1.2 MPa, a colloidal layer with a thickness of about 0.65 mm can achieve a positive tensile bond strength of up to about 12 MPa. The tensile bond strength may be up to about 26.7 MPa by adjusting the thickness. Taking the polyacrylate structure as an example, the shear bond strength of the metal substrate at a shear rate of about 10 mm/min can reach about 150 Kg/cm$^2$ (147 MPa), which is similar to the glass substrate.

Figure 3:
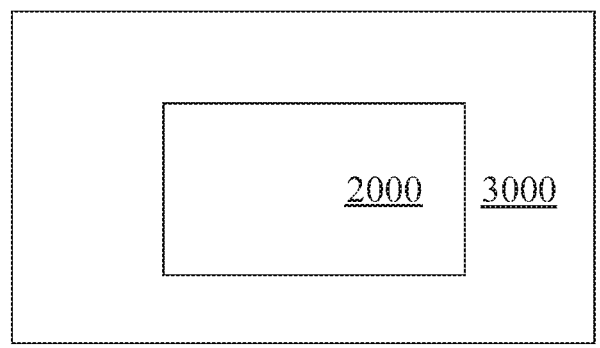
FIG. 3 is a schematic view of a display device according to an embodiment of the present disclosure.

FIG. 3 is a schematic diagram of a display device 3000 according to an embodiment of the present disclosure.

As shown in FIG. 3, the display device 3000 according to an embodiment of the present disclosure may include the display panel 2000 as described above. The display device in the embodiment of the present disclosure may be any product or component having a display function, such as a mobile phone, a tablet computer, a television, a notebook computer, a digital photo frame, a navigator, and the like.

Embodiments of the present disclosure also provide a method for detecting a package structure.

Figure 4:
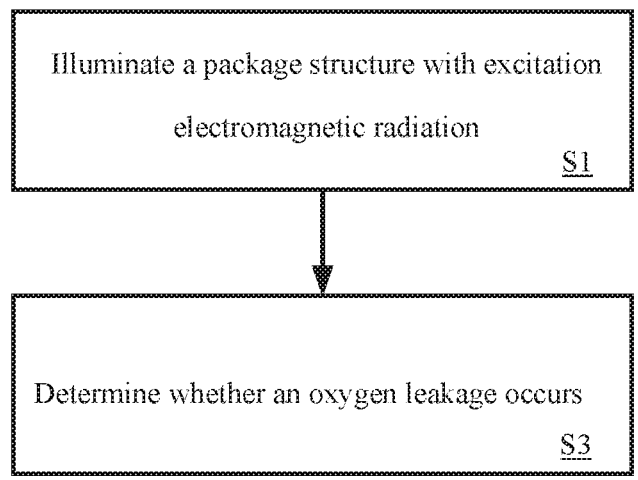
FIG. 4 is a flow diagram of a method for detecting a package structure according to an embodiment of the present disclosure.

FIG. 4 is a flow diagram of a method for detecting a package structure according to an embodiment of the present disclosure.

As shown in FIG. 4, a method for detecting a package structure according to an embodiment of the present disclosure includes:

S1. Illuminating a package structure according to an embodiment of the present disclosure with excitation electromagnetic radiation. The package structure includes a first package layer and a second package layer disposed opposite to each other, and a sealing element between the first package layer and the second package layer for forming a sealed space between the first package layer and the second package layer. The package structure further includes a detecting element located in the sealed space, the detecting element including an oxygen sensitive material, the oxygen sensitive material including a material whose light emission characteristics are changed after exposure to oxygen.

S3. Determining whether the sealing element has an oxygen leak based on a light emission characteristic of the detecting element.

Figure 5:
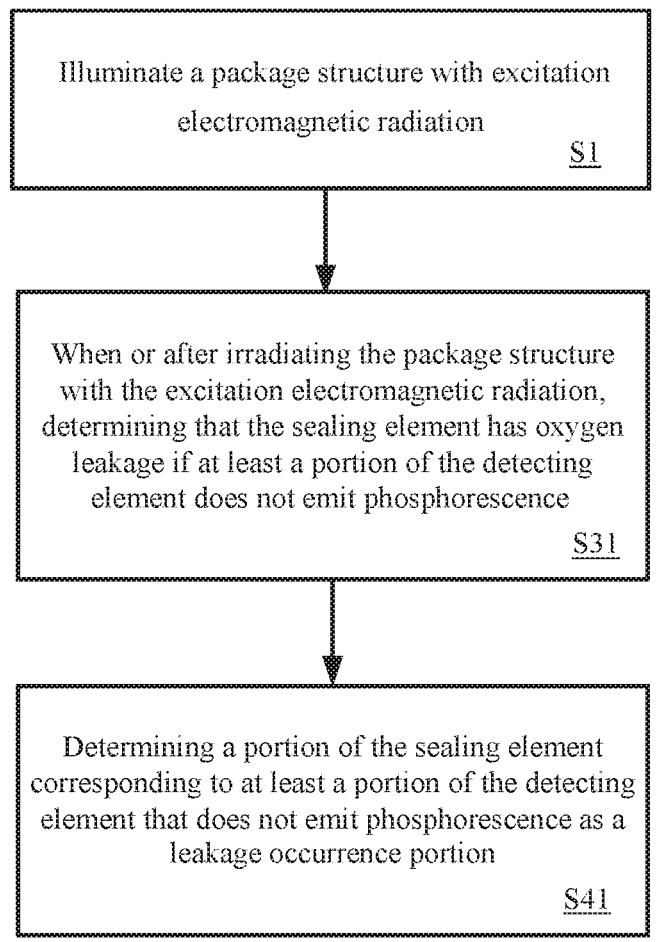
FIG. 5 is a flow diagram of a method for detecting a package structure according to an embodiment of the present disclosure.

FIG. 5 is a flow diagram of a method for detecting a package structure according to an embodiment of the present disclosure.

In some embodiments of the present disclosure, the oxygen sensitive material includes a phosphorescent material, and determining whether the sealing element has an oxygen leak based on a light emission characteristic of the detecting element includes when or after irradiating the package structure with the excitation electromagnetic radiation, if at least a portion of the detecting element does not emit phosphorescence, the sealing element is determined to have an oxygen leakage. The method further includes determining that the sealing element has oxygen leakage in response to at least a portion of the detecting element not emitting phosphorescence.

As shown in FIG. 5, the method for detecting a package structure may include:

S1. Irradiating the package structure according to embodiments of the present disclosure with excitation electromagnetic radiation.

S31. When or after irradiating the package structure with the excitation electromagnetic radiation, determining that the sealing element has oxygen leakage if at least a portion of the detecting element does not emit phosphorescence.

S41. Determining a portion of the sealing element corresponding to at least a portion of the detecting element that does not emit phosphorescence as a leakage occurrence portion.

Figure 6:
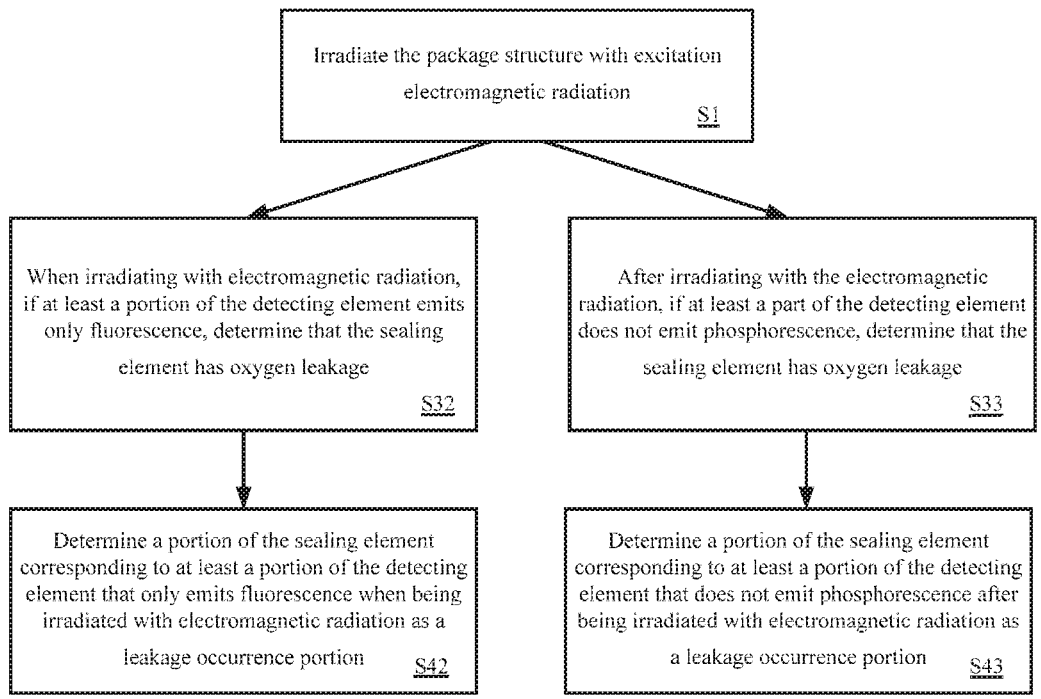
FIG. 6 is a flow diagram of a method for detecting a package structure according to an embodiment of the present disclosure.

FIG. 6 is a flow diagram of a method for detecting a package structure according to an embodiment of the present disclosure.

In some embodiments of the present disclosure, the oxygen sensitive material includes a fluorescent phosphorescent dual emitting material or a combination of a fluorescent phosphorescent dual emitting material and a phosphorescent material. In such embodiments, determining whether the sealing element has an oxygen leak based on a light emission characteristic of the detecting element includes, if at least a part of the detecting element emits only fluorescence, determining that the sealing element has an oxygen leak, or, after irradiating with electromagnetic radiation, if at least a portion of the detecting element does not emit phosphorescence, determining that the sealing element has an oxygen leak. In some embodiments of the present disclosure, the method for detecting a package structure may further include determining a portion of the sealing element corresponding to at least a portion of the detecting element that only emits fluorescence when being irradiated with electromagnetic radiation as a leakage occurrence portion, or, determining a portion of the sealing element corresponding to at least a portion of the detecting element that does not emit phosphorescence after being irradiated with electromagnetic radiation as a leakage occurrence portion.

As shown in FIG. 6, a method for detecting a package structure according to embodiments of the present disclosure includes:

S1. Irradiating the package structure according to embodiments of the present disclosure with excitation electromagnetic radiation.

S32. When irradiating with electromagnetic radiation, if at least a portion of the detecting element emits only fluorescence, determining that the sealing element has oxygen leakage.

S42. Determining a portion of the sealing element corresponding to at least a portion of the detecting element that only emits fluorescence when being irradiated with electromagnetic radiation as a leakage occurrence portion.

Or

S1. Irradiating the package structure according to embodiments of the present disclosure with excitation electromagnetic radiation.

S33. After irradiating with the electromagnetic radiation, if at least a part of the detecting element does not emit phosphorescence, determining that the sealing element has oxygen leakage.

S43. Determining a portion of the sealing element corresponding to at least a portion of the detecting element that does not emit phosphorescence after being irradiated with electromagnetic radiation as a leakage occurrence portion.

In some embodiments of the present disclosure, the fluorescent phosphorescent dual emissive material may include a copolymer of aromatic ketone monomer units. The copolymer may include at least one of the following polyurethanes, polylactides, and polyacrylates. The electromagnetic radiation can be ultraviolet light.

For example, the polyurethane may have the following structure:

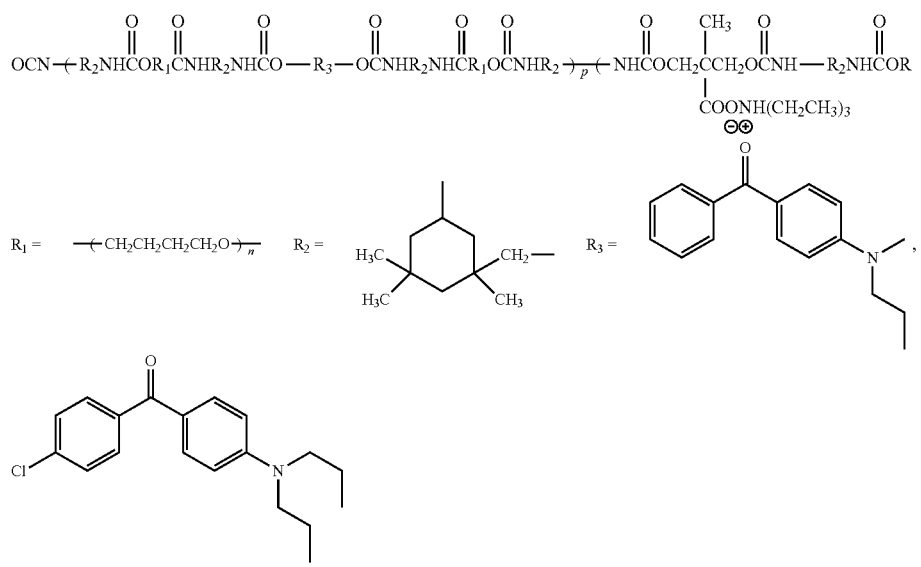

For example, polylactide may have the following structure:

For example, the polyacrylate may have the following structure:

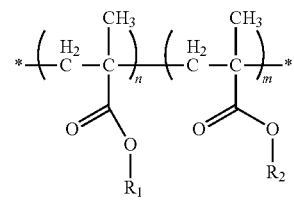

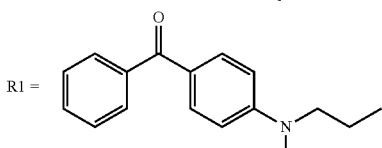

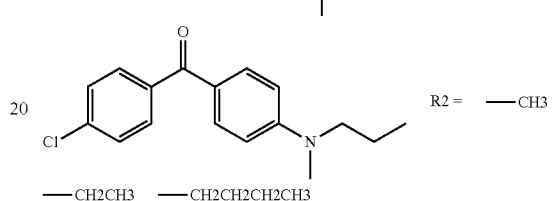

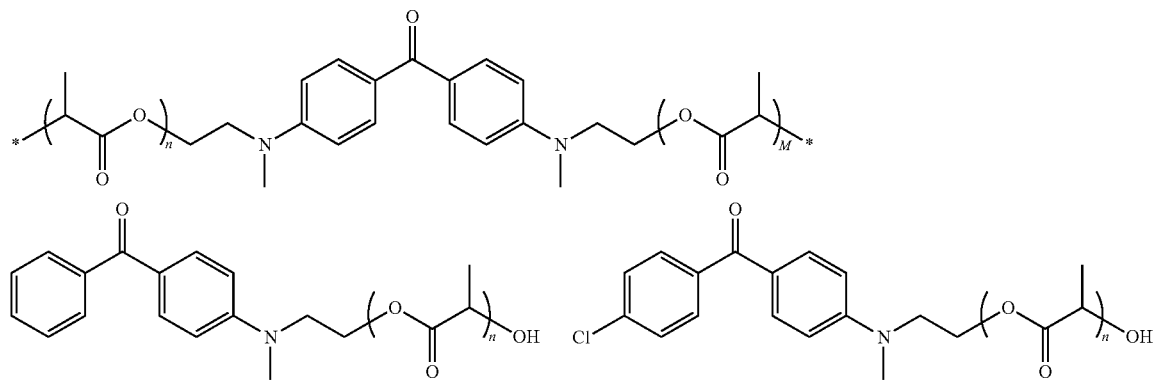

The method for detecting a package structure provided by the embodiments of the present disclosure is simple, has wide application range, high precision, low cost, and can further enhance the sealing effect.

The principle of the above method for detecting the package structure is related to the luminescent properties of fluorescence and phosphorescence. Fluorescence is caused by electrons' transition from the lowest vibrational level of the first excited singlet state to the ground state. The luminescence time of fluorescence is relatively short, about $10^{-7}$-$10^{-9}$s. Fluorescence luminescence does not exist after the excitation electromagnetic radiation stops. Phosphorescence is caused by electrons' transition from the lowest vibrational energy level of the first excited triplet state to the ground state. Phosphorescence has a longer luminescence time of about $10^{-6}$ s. After the excitation electromagnetic radiation, such as ultraviolet light, is stopped, the luminescence phenomenon of the phosphorescence continues to exist (phosphorescence afterglow). When oxygen is present, the oxygen causes luminescence quenching and the phosphorescent material does not emit phosphorescence.

Figure 7:
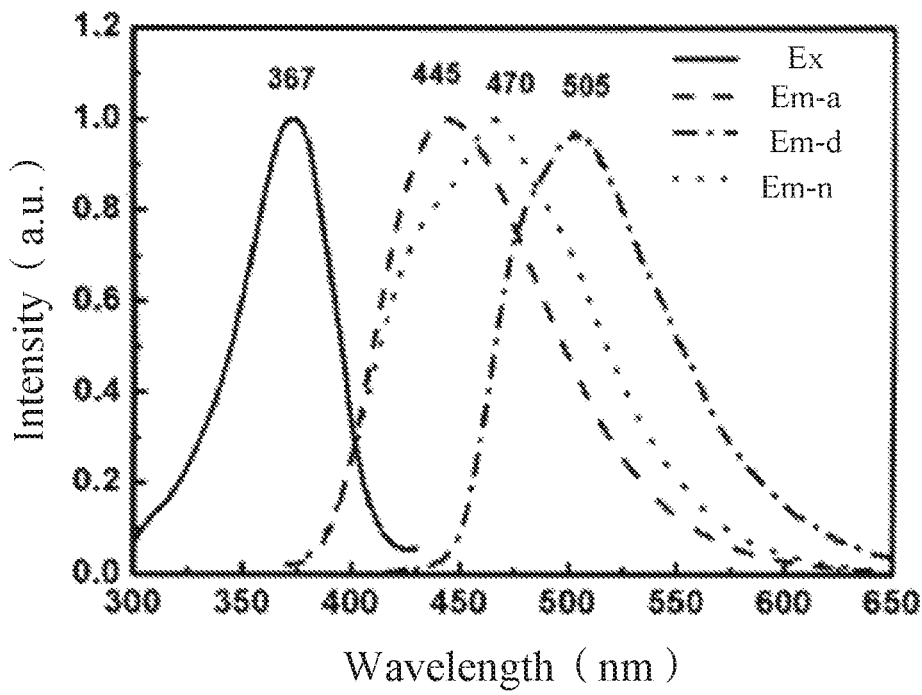
FIG. 7 is a spectrogram of an oxygen sensitive material of a detecting element of a package structure according to an embodiment of the present disclosure.

FIG. 7 is a spectrogram of an oxygen-sensitive material of a detecting element of a package structure according to an embodiment of the present disclosure, wherein an organic fluorescent phosphorescent dual emitting material is employed. In FIG. 7, Ex represents the excitation spectrum of the fluorescent phosphorescent dual emitting material. It can be seen that the emission intensity reaches the maximum when the excitation wavelength is around 367 nm (ultraviolet light). Therefore, ultraviolet light can be used as excitation electromagnetic radiation to illuminate the package structure.

Em-a represents the emission spectrum of a fluorescent phosphorescent dual emitting material in an air atmosphere. In the air atmosphere, the phosphorescent dual emitting material emits only fluorescence due to the phosphorescence quenching caused by the oxygen. It can be seen that the intensity of the emitted light of about 445 nm is the largest. In this case, the fluorescent phosphorescent dual emitting material can be observed by the naked eye to emit blue-violet light.

Em-n represents the emission spectrum of a fluorescent phosphorescent dual emitting material in a nitrogen atmosphere. Since nitrogen is an inert gas, it does not affect the luminescence characteristics of the oxygen-sensitive material. Therefore, the luminescence spectrum obtained in a nitrogen atmosphere is consistent with the luminescence spectrum of a package structure such as a display panel when the sealing is intact. The fluorescent phosphorescent dual emitting material is capable of emitting mixed light of fluorescence and phosphorescence under excitation of electromagnetic radiation. The intensity of the emitted light is max when the wavelength is around 470 nm. Therefore, in a nitrogen atmosphere, when irradiating with ultraviolet light, the fluorescent phosphorescent double-emitting material can be observed by the naked eye to emit blue light.

Em-d represents the phosphorescence afterglow spectrum of the fluorescent phosphorescent dual emitting material in a nitrogen atmosphere. In a nitrogen atmosphere, the phosphorescence of the phosphorescent dual-emitting material does not quench. Therefore, after the excitation of the electromagnetic radiation such as ultraviolet light is turned off, phosphorescence afterglow is also present. The phosphorescence afterglow has the highest intensity of emitted light when the wavelength is around 505 nm. Therefore, after the ultraviolet light is turned off under a nitrogen atmosphere, the fluorescent phosphorescent dual emitting material can be observed by the naked eye to emit green phosphorescence afterglow.

It can be seen from FIG. 7 that if the package structure is intact, when the package structure is irradiated with ultraviolet light, blue fluorescent phosphorescent light can be emitted; when the ultraviolet light is turned off, green phosphorescence afterglow can be seen. If the package structure is broken, the oxygen enters and affects the phosphorescence emission of the oxygen sensitive material. When the package structure is irradiated with ultraviolet light, blue fluorescence can be emitted; when the ultraviolet light is turned off, the package structure does not emit light. Therefore, it is possible to determine whether or not oxygen leakage has occurred in the package structure by the light emission.

Based on the principles of the present disclosure, embodiments of the present disclosure also provide a detecting device for detecting whether the package structure is subjected to oxygen exposure, The device includes an illumination source for emitting electromagnetic radiation to the package structure, and a sensor for detecting a change in the light emission characteristics of an oxygen-sensitive material in a package structure.

In some embodiments of the present disclosure, the illumination source employs an ultraviolet light source.

In some embodiments of the present disclosure, the sensor employs a spectrometer.

By using the above detection device, illumination source emits UV light around the film being detected for a circle and the color change of the detection film being detected may be observed. The package effect can be accurately determined and the position of the package damage can be determined. With the help of a spectrometer, the automatic package structure seal detection, including the location and size of the package sealing damage detection, can be realized.

Embodiments of the present disclosure also provide a method of fabricating a package structure. The method includes providing an oxygen sensitive material, disposing the oxygen sensitive material on the first package layer and/or the second package layer, and aligning the first package layer with the second package layer, wherein a sealed space is formed between the first package layer and the second package layer through the sealing element.

An embodiment of the present disclosure further provides a method for fabricating a display panel. Based on the method for fabricating the package structure described above, the method for fabricating a display panel includes providing an oxygen sensitive material, disposing the oxygen sensitive material and a sealant on a substrate, and aligning the substrate and a cover plate.

In some embodiments of the present disclosure, the oxygen sensitive material is a high molecular polymer. The oxygen sensitive material may be a solution or a melt liquid. Disposing the oxygen sensitive material on the substrate may include uniformly coating a polymer liquid or a melt liquid in a space between the sealant and the light emitting device. The height of the polymer liquid or the melt liquid may be similar with the height of the sealant. Aligning the substrate and the cover plate may include aligning the substrate and the cover plate under a vacuum condition.

In some embodiments of the present disclosure, the method of fabricating the display panel may further include performing curing. For example, a high temperature curing may be performed to cure the sealant, while also allowing the polymer liquid or melt liquid to be cured to form a film for use as a test film.

For the package structure fabricated by the above method, the detection method as described above can be used to detect the package effect. For example, in the case of the display panel, the display panel can be detected by ultraviolet light for a circle, and the change of the light emission characteristics of the display panel can be observed. The packaging effect of the display panel can be determined. In the case where the package is cracked, the crack position can also be determined.

Certain specific embodiments have been described, and these embodiments are exhibited merely by examples and are not intended to limit the scope of the present disclosure. Indeed, the novel embodiments set forth herein may be implemented in a variety of other forms; in addition, various omissions, substitutions, and changes can be made in the form of the embodiments set forth herein without departing from the spirit of the present disclosure. The appended claims and equivalents thereof are intended to cover this form or modification thereof that fall within the scope and spirit of the present disclosure.

What is claimed is:

1. A method for detecting a package structure, comprising:
    irradiating the package structure with excitation electromagnetic radiation, wherein the package structure comprises:
        a first package layer and a second package layer disposed opposite to each other;
        a sealing element between the first package layer and the second package layer for forming a sealed space between the first package layer and the second package layer; and
        a detecting element located in the sealed space, the detecting element comprising an oxygen sensitive material, and the oxygen sensitive material comprising a material whose light emission characteristics are changed after exposure to oxygen; and
    determining whether the sealing element has an oxygen leak based on a light emission characteristic of the detecting element,
    wherein the oxygen sensitive material comprises a fluorescent phosphorescent dual emitting material or a combination of a fluorescent phosphorescent dual emitting material and a phosphorescent material, and wherein determining whether the sealing element has an oxygen leak based on a light emission characteristic of the detecting element comprises:
        when irradiating with electromagnetic radiation, in response to at least a portion of the detecting element emitting only fluorescence, determining that the sealing element has an oxygen leak; or
        after irradiating with electromagnetic radiation, in response to at least a portion of the detecting element not emitting phosphorescence, determining that the sealing element has an oxygen leak.

2. The method for detecting the package structure according to claim 1, further comprising:
    determining a portion of the sealing element corresponding to at least the portion of the detecting element that only emits fluorescence while being irradiated with electromagnetic radiation as a leakage occurrence portion; or
    determining a portion of the sealing element corresponding to at least the portion of the detecting element that does not emit phosphorescence after being irradiated with electromagnetic radiation as a leakage occurrence portion.

3. The method for detecting the package structure according to claim 2, wherein the fluorescent phosphorescent dual emissive material comprises a copolymer of aromatic ketone monomer units.

4. The method for detecting the package structure according to claim 1, wherein the fluorescent phosphorescent dual emissive material comprises a copolymer of aromatic ketone monomer units.

5. The method for detecting the package structure according to claim 4, wherein the copolymer comprises at least one of the following:
    polyurethane, polylactide, and polyacrylate.

* * * * *